(12) United States Patent
Chang et al.

(10) Patent No.: US 6,989,592 B2
(45) Date of Patent: Jan. 24, 2006

(54) INTEGRATED POWER MODULE WITH REDUCED THERMAL IMPEDANCE

(75) Inventors: Jie Chang, Thousand Oaks, CA (US); Stephen Chiu, Thousand Oaks, CA (US); Winfred Morris, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 372 days.

(21) Appl. No.: 10/137,094

(22) Filed: May 1, 2002

(65) Prior Publication Data

US 2003/0205806 A1 Nov. 6, 2003

(51) Int. Cl.
*H01L 23/34* (2006.01)
*H01L 23/10* (2006.01)

(52) U.S. Cl. .................... 257/707; 257/712; 257/713; 257/717; 257/719; 257/720

(58) Field of Classification Search ............... 257/706, 257/707, 712, 713, 718, 719, 720, 717
See application file for complete search history.

(56) References Cited

U.S. PATENT DOCUMENTS

| | | | | | |
|---|---|---|---|---|---|
| 5,309,983 | A | * | 5/1994 | Bailey | 165/80.3 |
| 6,181,556 | B1 | * | 1/2001 | Allman | 361/690 |
| 6,229,216 | B1 | * | 5/2001 | Ma et al. | 257/777 |
| 6,442,033 | B1 | * | 8/2002 | Liu et al. | 361/743 |
| 6,580,611 | B1 | * | 6/2003 | Vandentop et al. | 361/704 |

OTHER PUBLICATIONS (Exhibit 1) POWEREX CM25MD–24H product specification sheets, (2 pages). Jul. 1997. Powerex, Inc., Youngwood, PA, USA, Tel 412 925 7272. The power module and internal power devices are rated at 1200 V, 25 A. It integrated in: a 3–phase IGBT inverter bridge consisting 6 IGBT devices and 6 power diode devices, a 3–phase uncontrolled rectifier bridge consisting 6 power diode devices and a DC–link voltage brake device as shown in a circuit schematic in Exhibit 2.
(Exhibit 2) Circuit schematic of Integrated Power Module and package outline illustration, CM25MD–24H, Jul. 1997, POWEREX Inc, Youngwood, PA, USA, Tel 412 925 7272.
(Exhibit 3) An example of a damaged prototype of an Integrated Power Module of modified CM25MD–24H. The damage is due to improper contact of the thermal–interface material that has low or insufficient di–electrical strength. May 25, 2004, Dr. Jie Chang, U.S.A. The damaged example module is available for inspection.

* cited by examiner

*Primary Examiner*—Nathan J. Flynn
*Assistant Examiner*—Victor A. Mandala, Jr.
(74) *Attorney, Agent, or Firm*—Shimokaji & Associates, P.C.

(57) ABSTRACT

A dual-side thermal interface and cooling design of an integrated power module is disclosed which effectively reduces the equivalent thermal impedance on the power module by 20%. This in turn reduces the temperature rise of the junction temperature of the power devices inside the power module by 20% with an equivalent load current. As a consequence the weight and volume associated with the conventional cooling mechanism not employing a dual thermal interface is reduced, thus increasing the ambient operating temperature limit of a power converter in the module.

14 Claims, 5 Drawing Sheets

INTEGRATED POWER MODULE WITH REDUCED THERMAL IMPEDANCE

BACKGROUND OF THE INVENTION

This present invention generally relates to high-power-density power modules and, more specifically; to an electrically-powered, high-power-density power module useful as a power converter or inverter that can operate in an elevated temperature environment, with reduced weight and size, and increased reliability, which are critical for aircraft, space, military as well as many industrial applications.

In a completely sealed vehicle compartment, such as found on electrical aircraft and spacecraft subsystems, the ambient temperature of the power converters can be over 90 degrees centigrade, which is often dictated by use of hydraulic fluid as the coolant. However, a conventional power converter design is unable to achieve this operating temperature due to the built in thermal impedance of the power device or module and limited power device junction temperature.

IGBTs (Isolated Gate Bipolar Transistors) are popular power devices in use as pulse-width modulated power converters/inverters. However, their junction temperature is rated for operation at or below 125 degrees centigrade in accordance with FIG. 5.

The devices must be derated to zero operating power at 150 degrees centigrade. The temperature effects on power semiconductor device parameters also include increased on-resistance or on-stage forward voltage drop, increased leakage current, reduced break down voltage and reduced switching speed. These effects significantly increase total power loss, thus increasing thermal stress and cooling requirements for the power devices and decreasing the converter efficiency.

As can be seen, there is a need for a dual-side thermal interface and cooling design which effectively reduces the equivalent thermal impedance on the power module by 20% and which also reduces the temperature rise of the junction temperature of the power devices inside the power module by 20% with an equivalent load current. Such a dual-side thermal interface and cooling design reduces the weight and volume associated with conventional cooling mechanisms not employing a dual thermal interface and increases the ambient operating temperature limit of the power converter.

SUMMARY OF THE INVENTION

In one aspect of the present invention, an integrated power module includes a power module in a fully-integrated electrical-and-thermal package having a top and a bottom side, a number of pairs of semiconductor or other types of power devices embedded in the package, a thermal interface on the bottom and top sides of the package for conducting heat generated by the internal power devices, and a heat remover in thermal communication with each of the thermal interfaces for dissipating the thermal interfaces. An electronic interface is also provided between the top thermal interface and its associated heat remover for supplying power to and receiving power from the semiconductor devices.

In another aspect of the invention there is disclosed a power module having a top and bottom side, a number of pairs of semiconductor or other types of power devices embedded in the module, a thermal interface on the bottom and top sides of the module, and a heat remover in thermal communication with each of the thermal interfaces.

In another aspect of the invention there is disclosed a power module having dual-sided thermal interfaces for improved cooling.

In yet another aspect of the invention there is disclosed a method for cooling an integrated power module containing a number of semiconductor power devices, and which includes dissipating heat and cooling the module by providing thermal interfaces on the opposed sides or the top and bottom surfaces of the module. The thermal impedance of a power semiconductor circuit and module is lowered by employing a new embedded thermal interface on the top side of a power module package, in addition to a compact bottom-side thermal interface provided via a base plate for increased cooling of the device, enabling elevated temperature operation.

Other aspects of the invention include having the top-side or front face thermal interface, for example a heat remover or exhaust fan, directly cool the internal power semiconductor dies, gate area of the switching devices, wire joints and bus joints, which are subject to heat flux concentration. A heat remover is employed adjacent the bottom face thermal interface to provide dual face cooling effective in reducing the inner thermal impedance between the power semiconductor devices and the external thermal interfaces. This feature in turn reduces the junction temperature rise of the power devices from their base plate/heat-sink temperature, thus allowing safer operation in elevated ambient temperatures and enabling a more compact package design and/or one of lower weight.

These and other features, aspects and advantages of the present invention will become better understood with reference to the following drawings, description, and claims

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention generally provides unique, dual-side, thermal interfaces on an integrated power module used on a commercially available IGBT power converter. The converter results in improved cooling of the module, which finds use, for example, in aircraft cooling systems and actuation systems. This is unlike the prior art in that dual-sided cooling of the module occurs with increased efficiency.

Figure 1:
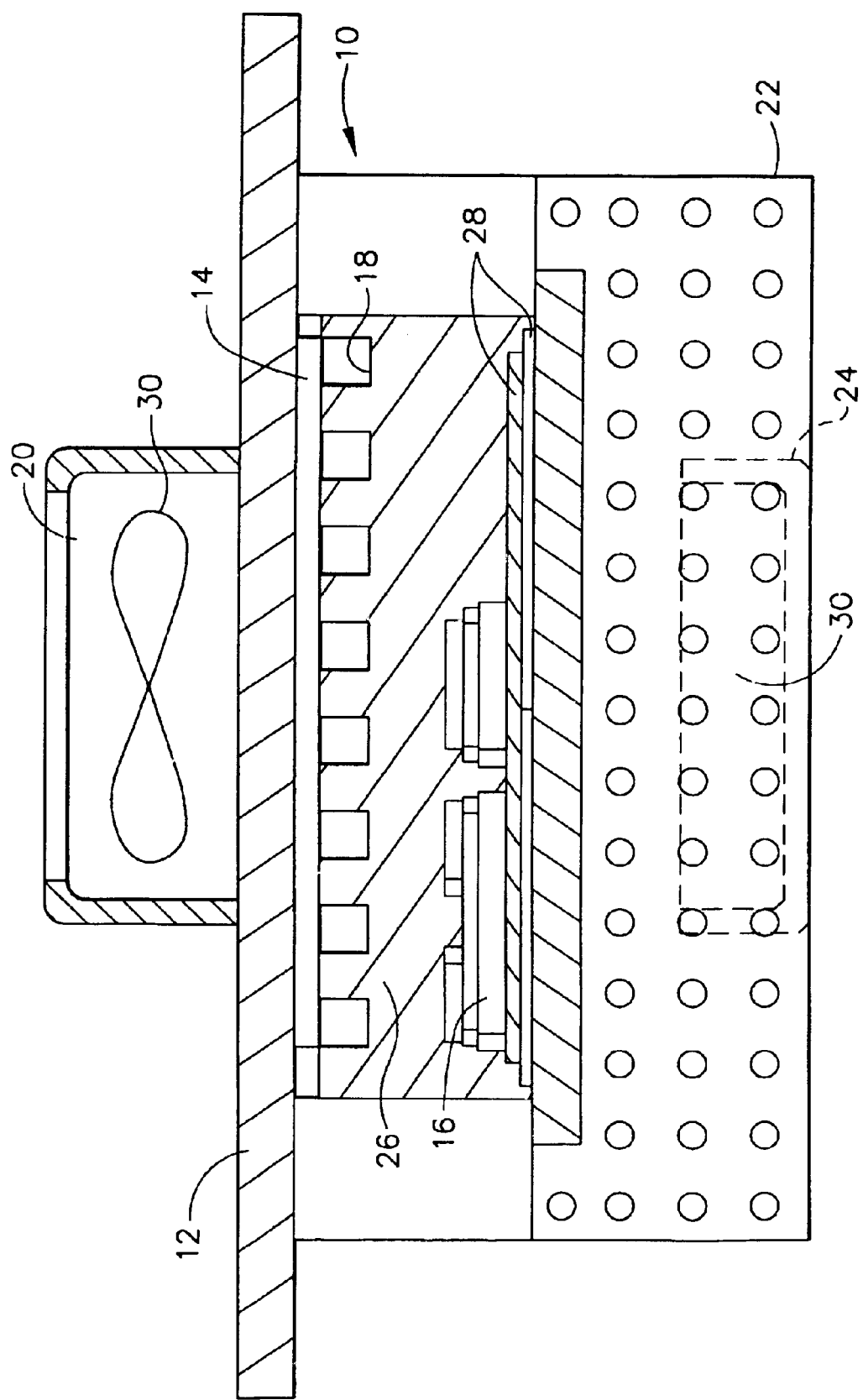
FIG. 1 is a cross-sectional view of a generic embodiment of a power module in accordance with the present invention.

Referring now to the accompanying drawings (in which like reference numbers indicate like parts throughout several views), and more particularly, to FIG. 1, there is shown a cross-sectional view of a generic embodiment of a power module in accordance with the present invention. The integrated power module 10 may include a PCB (Printed Circuit Board) electronic interface 12, which may be a standard PCB provided with pins for establishing an electrical connection between electronic control circuits and the power devices.

A front face thermal interface 14, which may be comprised of heat conducting materials such as copper, copper tungsten alloy or AlN (aluminum nitrite), may be encapsulated or embedded in a suitable epoxy material 26 (including for example any of several loaded epoxies, such as one sold under the trademark Stycast, which are engineered for high thermal conductivity and high voltage breakdown resistance) with pairs of power device dies 16, comprised of IGBTs and diodes. The IGBTs may be replaced by other silicon power devices including MOSFETs (Metal Oxide Semiconductor Field Effect Transistor), or silicon carbide (SIC) and silicon-on-insulator (SOI) dies or chips, connected to the PCB electronic interface 12. In fact, a three-phase bridge module may have six pairs of switching power devices and diode devices for a three-phase converter circuit. The typical cross section of the front face thermal interface 14 is further illustrated in FIG. 2, which is a perspective view of the power module of the invention.

One example of the materials used in the interface and their properties is set out in the following Table 1:

TABLE 1

| Material Layer | Thickness (mm) | Density (gm/cm$^3$) | Specific Heat (J/kg*K) | Thermal Cold (W/m*K) |
|---|---|---|---|---|
| Silicon | 0.4 | 2.34 | 712 | 148 |
| Solder | 0.1 | 8.42 | 176 | 50 |
| Cu (1) | 0.3 | 8.9 | 385.1 | 400 |
| Al$_2$O$_3$ | 0.635 | 3.8 | 795.35 | 21 |
| Cu (2) | 0.15 | 8.9 | 385.1 | 400 |
| Al | — | 2707 | 896 | 200 |
| Stycast | — | — | — | 1.5 |
| Air | — | 1.17 | 1005.7 | 0.028 |
| Plastic | — | — | — | 0.23 |

In the embodiment shown in FIG. 1, the epoxy material 26 may replace the usual low thermal conductivity backfill material used for environmental protection, but must be capable of performing the same function.

A heat remover 20, e.g., an exhaust fan or a heat pipe extending to an external fin system, may be provided on or in the PCB electronic interface 12 to remove heat from or directly cool the front face thermal interface 14, the power device dies 16, and the gate area of the switching devices, wire bonds and power bus joints (not shown), which have heat flux concentrations. In the embodiment illustrated in FIGS. 1 and 2, an internal fin system 18 may be created adjacent the front face thermal interface 14. The internal fin system 18, which may be bonded by epoxy to the front face thermal interface 14, may contain an entry hole 21 and a mounting platform (not shown) for the heat remover 20 to provide forced air cooling. The cooling air driven by the heat remover 20 may travel in both directions over the top surface of the epoxy material 26 above the power device dies 16 and through a copper fin system 28, removing heat from all the exposed surfaces as it exits the integrated power module 10.

Figure 2:
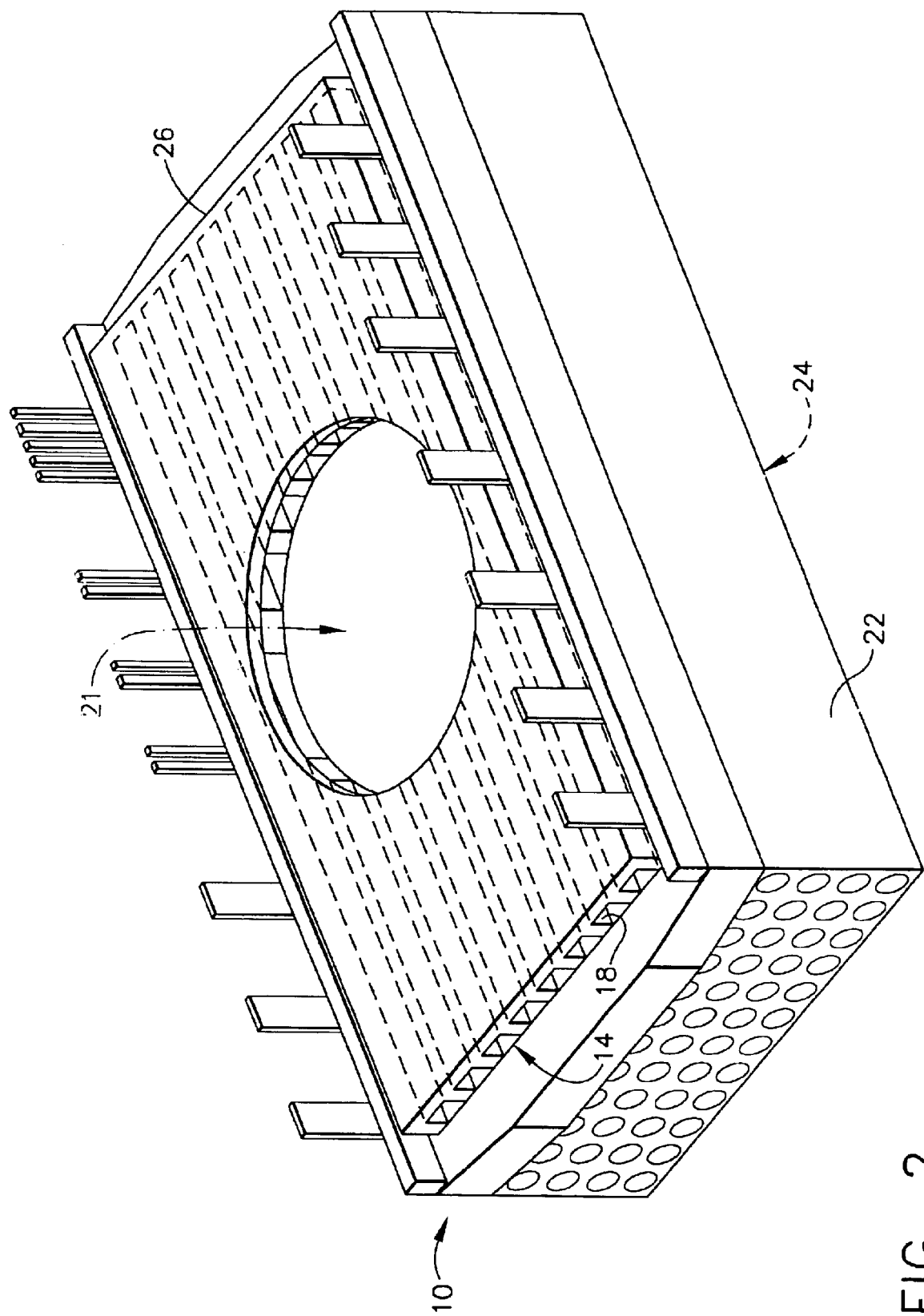
FIG. 2 is a perspective view of the power module of the invention having dual thermal interfaces used in the integrated module.

Still referring to FIGS. 1 and 2, the integrated power module 10 may include a second, bottom face thermal interface 22, in the baseplate, to provide both heat removal, voltage insulation, and an acceptable thermal expansion match with the IGBTs and diodes. The bottom face thermal interface 22 may be comprised of a DCB (Direct Copper Bounding) copper/alumina/copper structure bonded to a copper base plate, or any similar structure that accomplishes the same purposes. The bottom face thermal interface 22, connected to the opposite side of the power device dies 16 may also be connected using a high thermal conductive grease or may be directly hard bonded, such as by a high thermal conductivity epoxy, to one or more housed heat removers 24, for cooling or conducting heat from the integrated power module 10 and power device dies 16.

In the embodiment illustrated in FIGS. 1 and 2, dual exhaust fans 30 (one is shown) may drive cooling air through internal fin system 18 and copper fin system 28. For low profile, these fans 30 may be mounted inside and in the center of the heat remover 20, with air ducts connecting to the numerous internal fin system 18 channels that run parallel to the bottom face thermal inteface 22. The size and spacing of said channels may be chosen to maximize heat removal, by striking the correct balance between large channel surface areas and the need to maintain enough copper in the through thickness direction to conduct heat through the block to channels more distant from the base plate. Any of several designs, including additional fin arrangements, external fan mounted systems, or hear pipe based systems, may accomplish the same goal, although not necessarily with the same high efficiency.

The dual-side cooling may be effective in reducing the inner thermal impedance between power device dies 16, the front face thermal interface 14, and the bottom face thermal interface 22. This may reduce the junction temperature rise of the power device dies 16 from their baseplate/heat-sink temperatures, thus allowing safer operation in elevated ambient temperatures and enable a more compact, low weight module package design.

The integrated power module 10 has been tested and successfully operated at a full voltage of 480 RMS (650 VDC) and at a full power for a 3 horsepower AC machine at elevated temperatures that surpass 90 degrees centigrade. The power converter has been tested at full load in a sustained test routine. The new design reduces the equivalent thermal impedance of the power module over a conventional device by approximately 20%, as indicated in the following Table 2:

TABLE 2

| Technologies | Thermal dispassion front side (%) | Thermal dissipation back side (%) | Equivalent thermal impedance (pu) | Tj rise (degree C.) | Tj rise (pu) |
|---|---|---|---|---|---|
| Conventional 1 side interface | 1.12 | 98.88 | 1 | 49 | 1 |
| Proposed 2 side interface | 20.11 | 79.90 | 0.8 | 39 | 0.8 |

Figure 3:
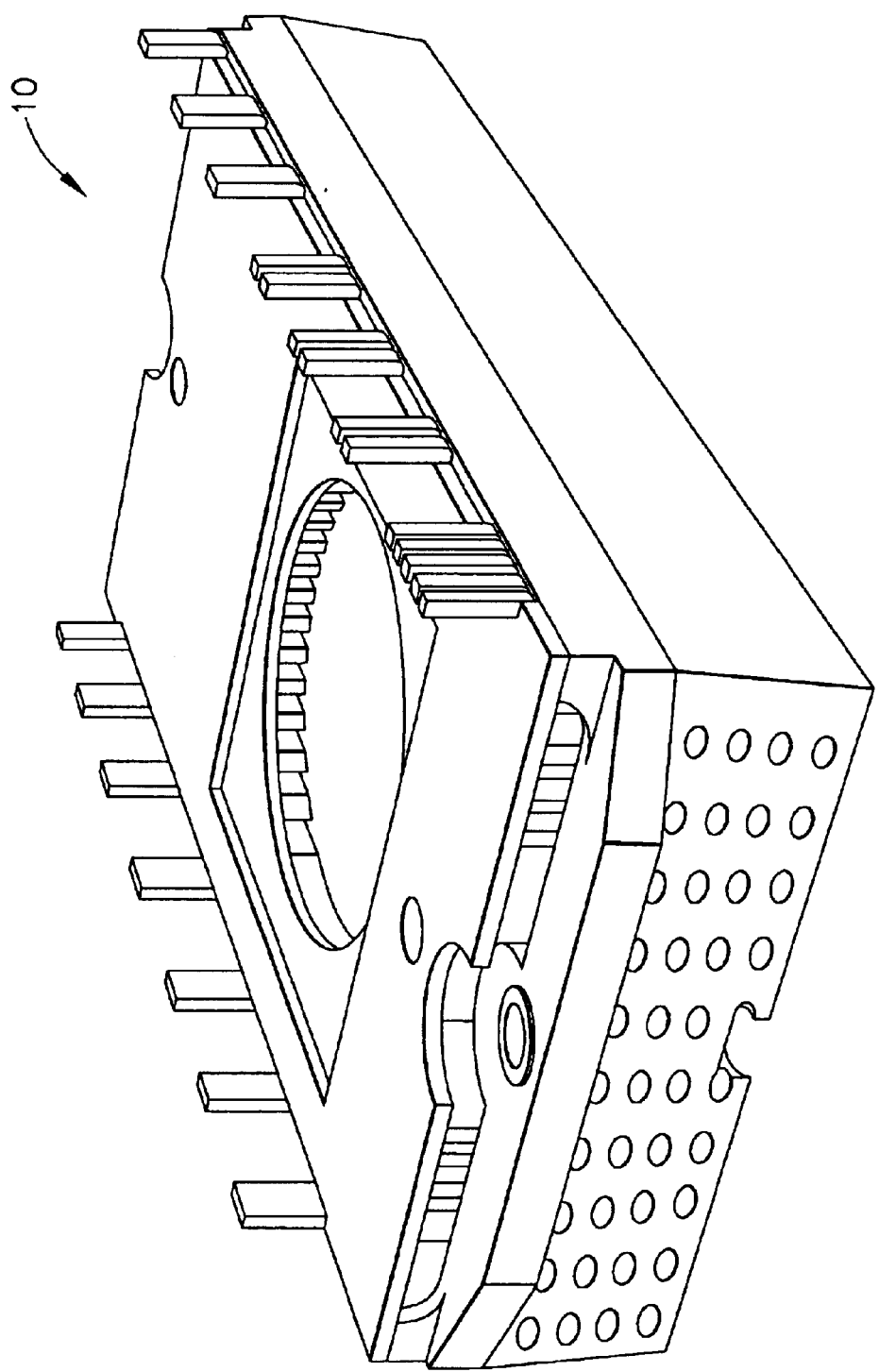
FIG. 3 is a perspective view of an experimental prototype of the integrated power module of the present invention.
Figure 4:
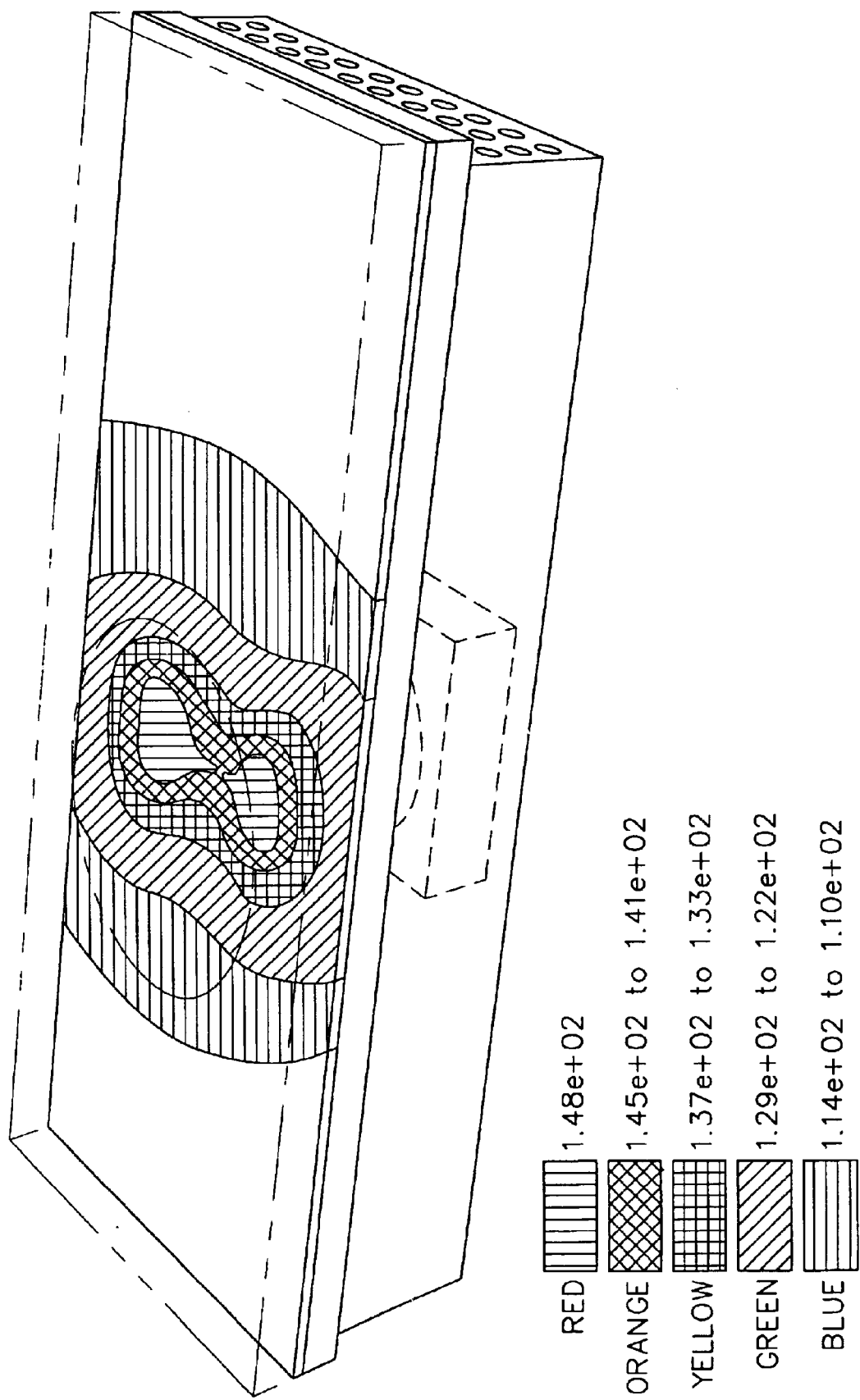
FIG. 4 illustrates the temperature distribution for an integrated power module of the present invention.
Figure 5:
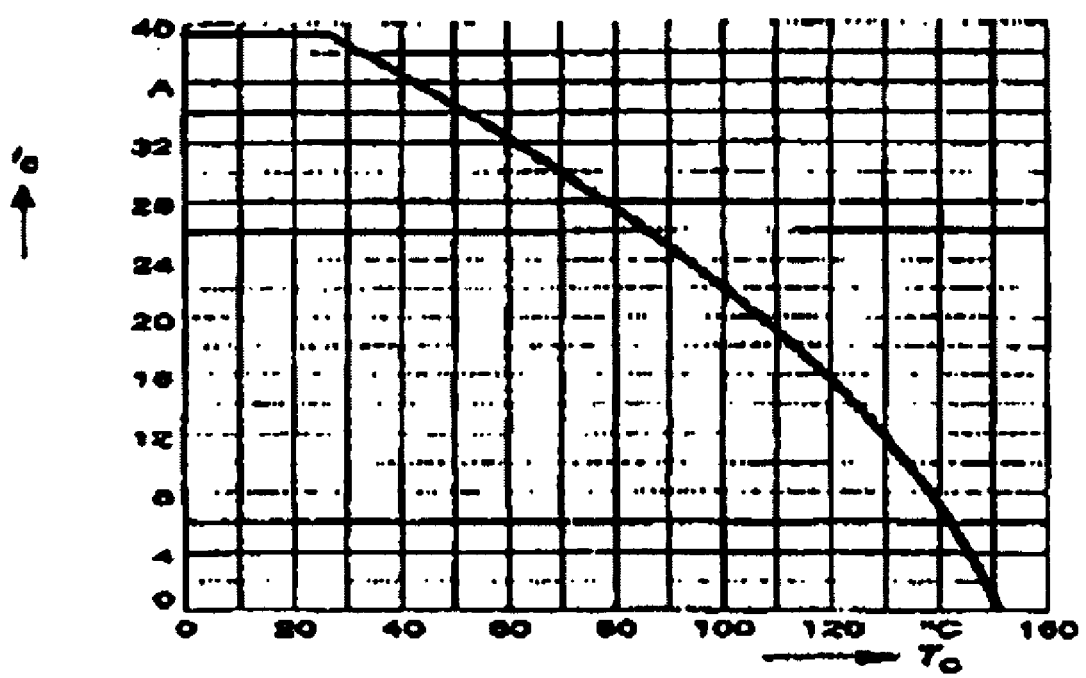
FIG. 5 is a chart illustrating junction temperature for operation of isolated Gate Bipolar Transistors according to the prior art.

This may effectively reduce the temperature rise of the junction temperature of the power devices inside the module by about 20% with an equivalent load current. FIG. 3 illustrates a perspective view of the experimental prototype of the integrated power module of the present invention used to obtain the above cited results, and FIG. 4 illustrates the temperature distribution for an integrated power module having two-side cooling.

It should be understood, of course, that the foregoing relates to preferred embodiments of the invention and that modifications made be made without departing from the spirit and scope of the invention as set forth in the following claims.

We claim:

1. An integrated elevated-temperature power module including:
   dual-side thermal interfaces for reduced total thermal impedance and improved cooling, wherein:
   said dual-side thermal interfaces include at least one embedded fan that is mounted inside at least one of a pair of heat removers and integrated with a pair of fin systems with air ducts connecting said at least one embedded fan to channels of at least one of said fin systems;
   said channels run parallel to a bottom face thermal interface; and
   said dual-side thermal interfaces include a front face thermal interface comprising:
   a high thermal conductivity epoxy material layer, wherein:
   the epoxy material layer comprises an epoxy material having high thermal conductivity and high voltage breakdown resistance;
   the epoxy material layer encapsulates a power device so that the epoxy material completely seals and surrounds the surfaces on all sides of the power device except for a bottom side and isolates the power device from cooling air.

2. The integrated power module of claim 1 including:
   a thermal interface including said bottom face thermal interface, a housed heat remover, a copper fin system, and an exhaust fan,
   said thermal interface on the bottom side of said power device forming a base plate to support said power device for conducting heat generated by said power device.

3. The integrated power module of claim 1 wherein:
   said dual-side thermal interfaces have no static air gap or air compartment between the surfaces of the power device and copper fin system;
   said dual-side thermal interfaces have no static air gap or air compartment between the surfaces of the power device and a front face thermal interface;
   said semiconductor power device is selected from the class consisting essentially of IGBT's, MOSFET's, diodes or other type of power devices, including silicon carbide (SiC) and silicon-on-insulator (SOI) devices; and
   said semiconductor power device is connected in a high-voltage power converter circuit chosen from the class consisting of: standard three-phase bridges suitable for commercial and industrial applications or single-phase bridges suitable for commercial and industrial applications.

4. The integrated power module of claim 1 including an electronic interface connected to said power device wherein:
   the electronic interface includes power bus joints and wire bonds; and
   the epoxy material layer encapsulates the power bus joints and the wire bonds.

5. An integrated power module including:
   a power module package having a top and bottom side, said package containing a number of commercially available semiconductor power device dies connected to form a high-voltage power converter circuit;
   a thermal interface on the front side of said package for conducting heat generated by said semiconductor power device dies and including a loaded epoxy material that encapsulates heat conducting materials with said semiconductor power device dies, with no static air gap between said loaded epoxy material and said semiconductor power device dies;
   a thermal interface on the bottom side of said package forming a base plate to support said package for conducting heat generated by said semiconductor power device dies; and
   at least one heat remover in thermal interface with each of said thermal interfaces for dissipating said heat from said thermal interfaces and cooling said semiconductor power device dies, wherein:
   each of said heat removers includes an embedded fan that is mounted inside each said heat remover,
   at least one of said heat removers includes a copper fin system,
   at least one of said heat removers includes an internal fin system with air ducts connecting at least one embedded fan to channels of said internal fin system, and
   said copper fin system, said internal fin system, and said embedded fans form an integrated system so that cooling air driven by said embedded fans removes heat through said copper fin system and said internal fin system so that a thermal impedance of said integrated power module is reduced.

6. The integrated power module of claim 5 wherein said loaded epoxy material encapsulates a copper or copper tungsten alloy or AlN that dissipates heat from the top side of said power module package.

7. An integrated power module comprising:
   a power module package having a top and bottom side;
   at least one pair of semiconductor power device dies embedded in said package, wherein said pair of semiconductor power device dies is connected as part of a high-voltage power converter circuit;
   a thermal interface on the top side of said package for conducting heat generated by said semiconductor power device dies and including a loaded epoxy material encapsulating said at least one pair of semiconductor power device dies, wherein said epoxy material is in direct contact with each of said semiconductor power device dies;
   a thermal interface on the bottom side of said package forming a base plate to support said package for conducting heat generate by said semiconductor power device dies;
   a first heat remover in thermal exchange with said thermal interface on the top side for dissipating said heat from said thermal interface on the top side and cooling said semiconductor power device dies;
   a second heat remover in thermal exchange with said thermal interface on the bottom side for dissipating said heat from said thermal interface on the bottom side and cooling said semiconductor power device dies wherein:
   said first heat remover includes a first fin system and a first embedded fan that is mounted inside said first heat remover with first air ducts connecting said first embedded fan to channels of said first fin system;
   said second heat remover includes a second fin system and a second embedded fan that is mounted inside said second heat remover with second air ducts connecting said second embedded fan to channels of said second fin system;
   said first and second embedded fans drive cooling air over said first and second fin systems so that heat is removed from all sides of said semiconductor power device dies and a thermal impedance of said integrated elevated-temperature power module is reduced; and an electronic interface connected to said semiconductor power device dies between said top side thermal interface and its associated heat remover.

8. The integrated power module of claim 7 wherein said semiconductor power device dies are selected from the class consisting essentially of: IGBT's, MOSFET'S, diodes or other type of power devices, including silicon carbide (SIC) and silicon-on-insulator (SOI) devices.

9. An integrated power module comprising:

a power module package having a plurality of sides;

a plurality of commercially available semiconductor power device dies connected as a three-phase bridge module having six pairs of switching power devices and diode devices for a three-phase converter circuit, and embedded in said package;

a first thermal interface on one side of said package for conducting heat generated by said semiconductor power device dies wherein said first thermal interface includes an epoxy material that encapsulates said semiconductor power device dies without air gap between said epoxy material and said semiconductor power device dies and encapsulates a heat conducting material selected from the group consisting of copper, copper tungsten alloy, and aluminum nitride;

a second thermal interface on another side of said package forming a support for said package for conducting heat generated by said semiconductor power device dies; and a pair of heat removers for dissipating heat from said thermal interfaces wherein:

a first of said pair of heat removers integrates a first fin system with a first embedded fan that is mounted inside said first heat remover with first air ducts connecting said first embedded fan to channels of said first fin system;

a second of said pair of heat removers integrates a second fin system with a second embedded fan that is mounted inside said second heat remover with second air ducts connecting said second embedded fan to channels of said second fin system;

said first and second fin systems form an integrated fin system so that said embedded fans drive cooling air over said integrated fin system so that heat is removed from all sides of said semiconductor power device dies; and an equivalent thermal impedance of said integrated elevated-temperature power module is reduced.

10. A method for cooling an integrated power module containing a number of semiconductor power device dies configured as a three-phase converter circuit, comprising the steps of:

dissipating heat and cooling said module by providing thermal interfaces on the opposed sides of said module, wherein at least one of said thermal interfaces encapsulates said power device dies in an epoxy material that also encapsulates a heat conducting material without air gaps between said power device dies and said epoxy material;

integrating at least one embedded fan, said at least one embedded fan being mounted inside a heat remover, with a pair of fin systems in said thermal interfaces wherein said integrating includes connecting said at least one embedded fan with air ducts to channels of said pair of fin systems; and reducing a thermal impedance of said integrated power module.

11. The method of claim 10 including the further step of conducting heat away from each of said thermal interfaces.

12. The method of claim 11 including the further step of conducting heat away from the front side of said package.

13. The method of claim 11 including the further step of conducting heat away from the bottom side of said package.

14. A method for improved cooling of an integrated elevated-temperature power module including dual side interfaces, comprising the steps of:

providing a power module package having a top side and bottom side and having a number of commercially available semiconductor power device dies configured as a three-phase bridge module having six pairs of switching power devices and diode devices for a three-phase converter circuit;

conducting heat generated on the front face of said package by said semiconductor power device dies using a first embedded fan, said first embedded fan being mounted inside a heat remover, integrated with a first fin system including connecting said first embedded fan with air ducts to channels of said first fin system;

forming a base plate on the bottom side of said package;

conducting heat generated on the bottom side of said package by said semiconductor power device dies using a second embedded fan integrated with a second fin system including connecting said second embedded fan with air ducts to channels of said second fin system, and integrating said embedded fans and fin systems with an epoxy material that encapsulates a heat conducting material with said power device dies without air gaps between said power device dies and said epoxy material to provide an integrated power module cooling system that reduces an equivalent thermal impedance of said integrated elevated-temperature power module.

* * * * *